United States Patent
Rueger et al.

(10) Patent No.: US 6,700,301 B2
(45) Date of Patent: Mar. 2, 2004

(54) METHOD AND DEVICE FOR DETECTING A FAULT CURRENT ACROSS A PIEZOELECTRIC ACTUATOR OF AN INJECTOR OR ITS HIGH VOLTAGE SUPPLY LEAD

(75) Inventors: Johannes-Jörg Rueger, Vaihingen/enz (DE); Matthias Mrosik, Stuttgart (DE); Marco Gangi, Esslingen (DE); Udo Schulz, Vaihingen/enz (DE)

(73) Assignee: Robert Bosch GmbH, Stuttgart (DE)

( * ) Notice: Subject to any disclaimer, the term of this patent is extended or adjusted under 35 U.S.C. 154(b) by 120 days.

(21) Appl. No.: 09/901,378

(22) Filed: Jul. 9, 2001

(65) Prior Publication Data

US 2002/0041475 A1 Apr. 11, 2002

(30) Foreign Application Priority Data

Jul. 7, 2000 (DE) .......................................... 100 33 196

(51) Int. Cl.$^7$ ............................................... H01L 41/08
(52) U.S. Cl. .............................. 310/316.03; 310/316.91
(58) Field of Search ...................... 310/316.01, 316.03

(56) References Cited

U.S. PATENT DOCUMENTS 6,275,765 B1 * 8/2001 Divljakovic et al. ......... 701/102
6,285,947 B1 * 9/2001 Divljakovic et al. ......... 701/110
6,380,659 B2 * 4/2002 Rueger et al. ............ 310/316.03

* cited by examiner

Primary Examiner—Mark Budd
(74) Attorney, Agent, or Firm—Kenyon & Kenyon

(57) ABSTRACT

A method and a device are described for detecting a fault current across a piezoelectric actuator (5) of an injector or its high voltage supply lead (6, 6a). Because the fault current upon contact with a person, for example, is relatively small compared to the useful current that charges or discharges the actuator, direct measurement of the current is not reliable. Therefore, it is suggested that, during the injection or in an injection pause, when the piezoelectric actuator (5) is charged, the voltage variation or a change in voltage (dU) be measured and the difference be compared to a predefined threshold value (S). When the threshold value (S) is exceeded, a fault message is produced, the voltage source is shut off, and/or the piezoelectric actuator (5) is discharged. The measured fault can be weighted using a counting algorithm. The method thus provides maximum protection upon contact, in particular for service personnel.

11 Claims, 4 Drawing Sheets

```
┌─────────────────────────────────────┐
│ Measurement of the actuator voltage │
│ of the triggering operation         │
└─────────────────────────────────────┘ 21
                  ↓
┌─────────────────────────────────────┐
│ Plausibility testing of the         │
│ measured actuator voltage           │
└─────────────────────────────────────┘ 22
                  ↓
┌─────────────────────────────────────┐
│           Fault debouncing          │
└─────────────────────────────────────┘ 23
                  ↓
┌─────────────────────────────────────┐
│         Updating of fault paths     │
└─────────────────────────────────────┘ 24
```

Figure 2

METHOD AND DEVICE FOR DETECTING A FAULT CURRENT ACROSS A PIEZOELECTRIC ACTUATOR OF AN INJECTOR OR ITS HIGH VOLTAGE SUPPLY LEAD

BACKGROUND INFORMATION

The present invention relates to a method and a device for detecting a fault current across a piezoelectric actuator of an injector or its high voltage supply lead, according to the definition of the species of the main claim. In known methods, piezoelectric actuators are charged using a voltage of up to several hundred volts, for example to 200 volts, to control the switching valve or the nozzle needle of an injector. For service personnel this high voltage may represent a hazardous voltage source that can lead to electric shock upon direct contact with current-carrying parts or the supply lead. For example, during contact with the supply lead, a short circuit to ground can result in a current of an order of magnitude of 200 mA. Applicable safety regulations, such as VDE[1] 100, allow such a current for only a limited duration in order to prevent hazardous ventricular fibrillation. The measurement and detection of a fault current is not a simple matter, however, because in comparison the useful current of 20 to 30 A is several orders of magnitude higher, thus making the fault current difficult to detect.

[1] Translator's note: Verband Deutscher Elektrotechniker (Association of German Electrical Engineers)

SUMMARY OF THE INVENTION

The method and the device according to the present invention for detecting a fault current across a piezoelectric actuator of an injector or its high voltage supply lead, having the characterizing features of the independent claims 1 and 11, in contrast, has the advantage that, by monitoring the voltage or the variation thereof across the charged actuator, even the relatively small fault current can be detected and protective measures can be effectively undertaken.

Advantageous developments of and improvements in the method described in the main claim derive from the measures represented in the subclaims. It is particularly advantageous that, in a fault scenario, a determined fault is weighted by a fault algorithm. Measurement errors or malfunctions, for example, are thus effectively suppressed, and only faults that actually occur are evaluated as such.

Furthermore, when an actual fault occurs, it is advantageous to shut off the voltage supply and also to discharge the actuator so rapidly that no contact hazard arises. In such a manner maximum protection is achieved and the danger of injury is largely avoided.

In a simple and particularly advantageous procedure, the voltage is determined at the beginning and at the end of the injection pause. Because the injection pause can last only several milliseconds, for example 2 ms, with the charged actuator, significant discharge of the actuator occurs during a short circuit.

For a system with multiple injection, it is also advantageous to perform voltage monitoring for individual injection pulses. The fault event can thus be detected early.

Since a plurality of actuators is generally supplied with high voltage from the power supply, it is advantageous to disconnect all actuators to increase safety.

Furthermore, it is advantageous to design the fault diagnosis in the form of a software program, since such a program can be created relatively easily. In addition, revisions can be made more readily.

The software program for fault diagnosis is advantageously incorporated into the control program for the actuator, thereby eliminating the need for additional hardware.

BRIEF DESCRIPTION OF THE DRAWINGS

FIG. 2 shows a flow chart.

DESCRIPTION OF THE EXEMPLARY EMBODIMENT

Figure 1:
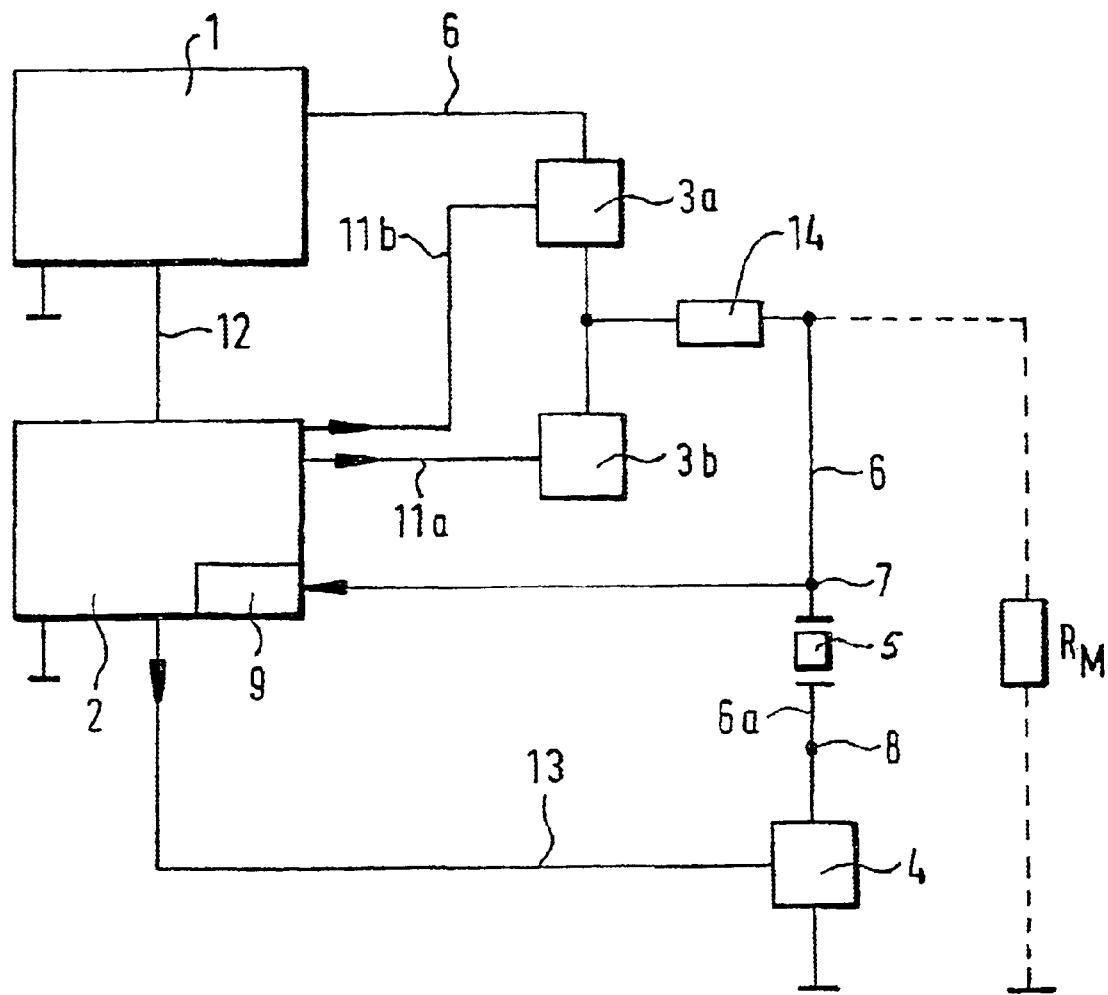
FIG. 1 shows a block circuit diagram.

FIG. 1 schematically shows a circuit diagram. A voltage source 1, connected to two first switches 3a, 3b that are connected in series, delivers the current or voltage for charging a piezoactuator 5. An inductor 14 is connected between switches 3a and 3b whose second terminal is connected to a terminal of piezoactuator 5 via a cable harness 6 and a plug connector 7. A second terminal of piezoactuator 5 is connected to a second switch 4 via a plug connector 8 and cable harness 6a, the return line of the second switch being connected to the return line of voltage source 1 (ground wire). Voltage source 1 as well as switches 3a, 3b, and 4 are connected to a control device 2 via control lines 11a, 11b, 12, and 13. Switches 3a, 3b, and 4 are preferably designed as semiconductor switches that transmit a high current and that also have high electric strength against the high charging voltage, which can be 200 volts or greater, depending on the type of actuator. Diodes are connected antiparallel to switches 3a, 3b, and 4 to allow a current to flow in the opposite direction.

It is customary to connect additional piezoactuators 5 in parallel to first switches 3a, 3b to form a bank. These piezoactuators have been omitted for clarity. If a plurality of actuators is interconnected to form a bank, second switch 4 is connected in series to each actuator 5 to enable the associated actuator 5 to be triggered. In this case, control device 2 switches second switch 4 to transmission or blocking mode, thereby allowing the actuator to charge or discharge, respectively.

The current flow can be controlled using first switches 3a, 3b. To this end, control device 2 sets first switches 3a, 3b to transmission mode or blocks them.

Control device 2 also includes a measurement unit 9 that measures the voltage, the voltage variation, or a change in voltage, for example, to plug connectors 7 and 8, to actuator 5, and/or to cable harness 6, 6a. The controller 2 also includes a computer 10 that contains all required components and is controlled by a corresponding software program.

The dotted line to plug connector 7 with resistor $R_M$ represents a leakage resistance that could occur, for example, upon contact by a person. In an injection pause, for example, when piezoactuator 5 is charged, measurement unit 9 detects the voltage of piezoactuator 5 at plug connector 7 such that the voltage can be evaluated by control device 2. If first switches 3a, 3b, for example, are blocked, piezoactuator 5 discharges through leakage resistor $R_M$ fairly rapidly since leakage resistor $R_M$ has a relatively low resistance. A capacitance of 6 µF, for example, for piezoactuator 5 and an assumed leakage resistance $R_M$ of 1K ohm results in a time constant of approximately 6 ms. This means that in an injection pause of 2 milliseconds for a double-switching control valve, for example, actuator 5 is discharged by up to 60 volts. The voltage is preferably measured at the end of the injection pause. It is not necessary to measure at the beginning of the injection pause because at that point actuator 5 was charged to the setpoint voltage specified by control device 2. From these two values, the voltage difference dU is determined after each charging process and compared to a predefined threshold value S. If the voltage difference dU lies below the predefined threshold value S, which for example can be established empirically, it can be concluded that no significant leakage current, which can be formed by the human body resistance $R_M$, is present. On the other hand, if the voltage difference dU exceeds the predefined threshold value S, a fault message is produced, voltage source 1 is shut off as promptly as possible, and/or piezoactuator 5 is discharged. This takes place with the assistance of switches 3a, 3b, and 4. Hazard from contact with parts conducting high voltage is thereby advantageously avoided.

As an alternative way of blanking out measurement errors or fault signals, the measured fault voltage is weighted with a predefined algorithm before a final fault is identified. This method will be described hereinafter in more detail, with reference to FIG. 4.

In an alternative embodiment of the present invention, the voltage variation is also measured at the beginning of the injection pause or at intervals, and is evaluated with respect to the predefined threshold value S.

Figure 3:
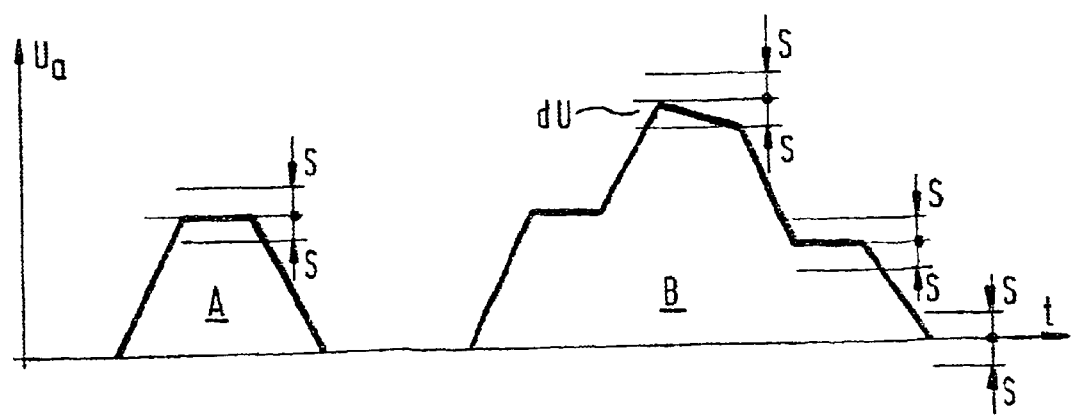
FIG. 3 shows a voltage diagram.
Figure 4:
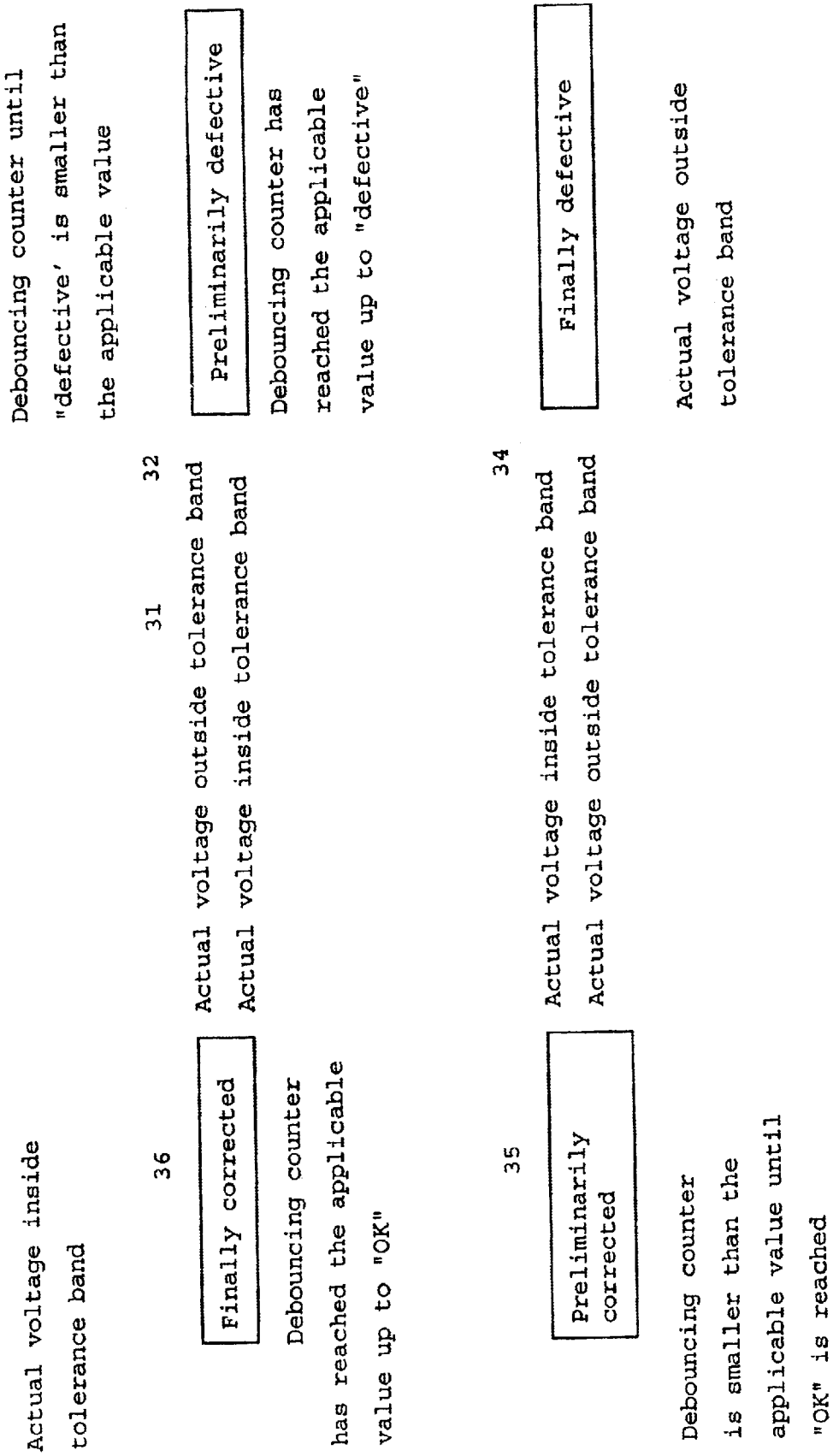
FIG. 4 shows a flow chart for fault weighting.

The mode of operation of the method is described in more detail, with reference to FIGS. 2 through 4. In the flow chart of FIG. 2, the actuator voltage Ua is first measured in step 21 at plug connector 7, for example, while the actuator is triggered. In step 22, the measured actuator voltage Ua is tested for plausibility. This procedure will be described hereinafter in more detail, with reference to FIG. 3. Fault debouncing according to FIG. 4 is performed in step 23, and the fault paths are updated in step 24.

FIG. 3 shows a typical voltage diagram for a multiple injection, where a first voltage pulse A for a pilot injection and a multistage voltage pulse for a main injection B are represented over the time axis t. During pilot injection A, the voltage ceiling of the predefined voltage Ua runs essentially horizontally, so that in this case no voltage deviation dU is present within the measurement phase. Thus, the thresholds S shown are not exceeded. In contrast, during main injection B the upper ceiling of voltage Ua drops with a difference dU. Depending on the magnitude of threshold S, a leakage resistance $R_M$ is indicated, which taking the weighting into consideration, can potentially lead to the fault message.

FIG. 4 shows a flow chart for the detection and weighting of fault conditions, i.e., fault debouncing. A simple counting algorithm is provided for weighting. In principle, each fault that occurs, i.e., all voltage differences dU above threshold S are summed up, and all values below threshold S are subtracted. A fault value is thus continuously obtained that is increased or decreased with each successive measurement. Only when multiple faults are measured in succession and a predefined, applicable threshold value, for example 5, is exceeded can it be assumed that a final fault (defect) is present that leads to the fault message and/or disconnection. This method is described below, with reference to FIG. 4. Starting from step 36, it is assumed that no fault is present and that the voltage difference dU lies within threshold S. If the actual voltage dU lies outside the tolerance band for threshold S, as shown by arrow 31, a preliminary defect is assumed in step 32. A debouncing counter is then started that iteratively counts upward or downward with each measurement. At this point, the fault is still considered to be preliminarily defective. If the debouncing counter has reached the applicable threshold value in step 34, then a final defect is present because the actual voltage has repeatedly been outside the tolerance band for threshold S. However, if the actual voltage (differential voltage dU) lies within the tolerance band, the fault in step 35 is considered to be preliminarily corrected. The debouncing counter positions itself on the value OK, since its value is smaller than that of the applicable threshold value. There is no fault condition below the threshold value, and the condition is finally corrected (step 36).

What is claimed is:

1. A method for detecting a fault current across one of a piezoelectric actuator of an injector and a high voltage supply lead thereof, comprising the steps of:

causing a control device to activate a plurality of switches;

in order to control a quantity of a fuel injected, causing the plurality of switches to one of charge and discharge the piezoelectric actuator from a voltage supply to a predefined voltage;

monitoring the predefined voltage across at least one of the piezoelectric actuator and the high voltage supply lead in a time period in which the piezoelectric actuator is charged;

determining a change in the predefined voltage; and reporting a fault when the change in the predefined voltage exceeds a predefined threshold.

2. The method according to claim 1, further comprising the step of:

weighting the fault in accordance with an algorithm.

3. The method according to claim 1, further comprising the step of:

shutting off the voltage supply when the predefined threshold is exceeded.

4. The method according to claim 3, wherein:

the piezoelectric actuator is discharged so rapidly that no contact hazard arises.

5. The method according to claim 1, further comprising the step of:

determining the predefined voltage at a beginning and at an end of an injection pause.

6. The method according to claim 5, wherein:

a setpoint voltage specified by the control device corresponds to a first voltage value at the beginning of the injection pause.

7. The method according to claim 1, wherein:

in a system with multiple injections, the monitoring of the predefined voltage is performed during all injection pulses.

8. The method according to claim 1, wherein:

the piezoelectric actuator belongs to a set of piezoelectric actuators, and when the fault occurs, all of the plurality of actuators are at least one of shut off and discharged.

9. The method according to claim 1, wherein:

a fault diagnosis is designed as a software program.

10. The method according to claim 9, wherein:

the software program is a component of a control program for the piezoelectric actuator.

11. A device, comprising:

a voltage source;

a program-controlled computer;

at least one switch that is connected in series with the voltage source and a piezoelectric actuator of an injector; and a measurement unit that detects a voltage across at least one of the piezoelectric actuator and a supply lead of the piezoelectric actuator in a time period in which the piezoelectric actuator is charged; wherein:

the measurement unit detects a first voltage across at least one of the piezoelectric actuator and the supply load of the piezoelectric actuator at a beginning of an injection pause, the measurement unit detects a second voltage across at least one of the piezoelectric actuator and the supply load of the piezoelectric actuator at an end of the injection pause, the program-controlled computer generates a voltage difference between the first voltage and the second voltage and compares the voltage difference to a predefined threshold, and when a value of the predefined threshold is exceeded the program-controlled computer at least one of shuts off the voltage source, discharges the piezoelectric actuator, and produces a warning signal.

* * * * *